US010861851B2

(12) United States Patent
Steigerwald et al.

(10) Patent No.: US 10,861,851 B2
(45) Date of Patent: Dec. 8, 2020

(54) WRAP-AROUND TRENCH CONTACT STRUCTURE AND METHODS OF FABRICATION

(71) Applicant: Intel Corporation, Santa Clara, CA (US)

(72) Inventors: Joseph Steigerwald, Forest Grove, OR (US); Tahir Ghani, Portland, OR (US); Oleg Golonzka, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/828,259

(22) Filed: Nov. 30, 2017

(65) Prior Publication Data

US 2018/0097003 A1 Apr. 5, 2018

Related U.S. Application Data

(63) Continuation of application No. 13/996,523, filed as application No. PCT/US2011/068218 on Dec. 30, 2011, now Pat. No. 9,876,016.

(51) Int. Cl.
*H01L 27/092* (2006.01)
*H01L 29/417* (2006.01)
(Continued)

(52) U.S. Cl.
CPC .... *H01L 27/0924* (2013.01); *H01L 21/76897* (2013.01); *H01L 23/485* (2013.01);
(Continued)

(58) Field of Classification Search
CPC . H01L 29/66795–66818; H01L 29/785–7856; H01L 29/41775;
(Continued)

(56) References Cited

U.S. PATENT DOCUMENTS 6,857,478 B1 2/2005 Weber
6,969,656 B2 11/2005 Du et al.
(Continued)

FOREIGN PATENT DOCUMENTS

CN 101189730 5/2008
CN 102310008 7/2011
(Continued)

OTHER PUBLICATIONS

Poon et al., "Resistivity and thermal stability of nickel mono-silicide", Applied Surface Science 157 (2000) 29-34.*
(Continued)

*Primary Examiner* — Vincent Wall
(74) *Attorney, Agent, or Firm* — Schwabe, Williamson & Wyatt, P.C.

(57) ABSTRACT

A wrap-around source/drain trench contact structure is described. A plurality of semiconductor fins extend from a semiconductor substrate. A channel region is disposed in each fin between a pair of source/drain regions. An epitaxial semiconductor layer covers the top surface and sidewall surfaces of each fin over the source/drain regions, defining high aspect ratio gaps between adjacent fins. A pair of source/drain trench contacts are electrically coupled to the epitaxial semiconductor layers. The source/drain trench contacts comprise a conformal metal layer and a fill metal. The conformal metal layer conforms to the epitaxial semiconductor layers. The fill metal comprises a plug and a barrier layer, wherein the plug fills a contact trench formed above the fins and the conformal metal layer, and the barrier layer lines the plug to prevent interdiffusion of the conformal metal layer material and plug material.

18 Claims, 10 Drawing Sheets

(51) Int. Cl.

| | |
|---|---|
| ***H01L 27/088*** | (2006.01) |
| ***H01L 29/66*** | (2006.01) |
| ***H01L 21/768*** | (2006.01) |
| ***H01L 23/485*** | (2006.01) |
| ***H01L 29/78*** | (2006.01) |

(52) U.S. Cl.
CPC .... *H01L 27/0886* (2013.01); *H01L 29/41766* (2013.01); *H01L 29/41791* (2013.01); *H01L 29/66795* (2013.01); *H01L 29/785* (2013.01); *H01L 2029/7858* (2013.01); *H01L 2924/0002* (2013.01)

(58) Field of Classification Search
CPC ......... H01L 29/41783; H01L 29/41791; H01L 2029/7857; H01L 2029/7858
See application file for complete search history.

(56) References Cited

U.S. PATENT DOCUMENTS

| | | | | |
|---|---|---|---|---|
| 7,190,050 | B2 | 3/2007 | Kina et al. | |
| 7,279,375 | B2 * | 10/2007 | Radosavljevic | H01L 29/41791 257/E21.444 |
| 7,692,254 | B2 * | 4/2010 | Anderson | H01L 29/41791 257/328 |
| 8,415,751 | B2 | 4/2013 | Mukheriee et al. | |
| 8,507,996 | B2 | 8/2013 | Sun | |
| 2004/0036127 | A1 | 2/2004 | Chau et al. | |
| 2004/0142524 | A1 | 7/2004 | Grupp et al. | |
| 2005/0218438 | A1 | 10/2005 | Lindert et al. | |
| 2005/0224800 | A1 * | 10/2005 | Lindert | H01L 29/66795 257/66 |
| 2008/0283925 | A1 | 11/2008 | Berthold | |
| 2009/0020819 | A1 | 1/2009 | Anderson | |
| 2010/0035400 | A1 | 2/2010 | Zhu | |
| 2010/0059807 | A1 | 3/2010 | Cho et al. | |
| 2010/0155845 | A1 | 6/2010 | Toba et al. | |
| 2010/0155846 | A1 * | 6/2010 | Mukherjee | H01L 21/28512 257/365 |
| 2010/0176438 | A1 | 7/2010 | Lue et al. | |
| 2011/0095372 | A1 | 4/2011 | Yuan | |
| 2011/0133259 | A1 | 6/2011 | Fischer et al. | |
| 2011/0147840 | A1 | 6/2011 | Cea et al. | |
| 2011/0175165 | A1 | 7/2011 | Yu et al. | |
| 2011/0260282 | A1 | 10/2011 | Kawasaki | |
| 2011/0272765 | A1 * | 11/2011 | Seo | H01L 23/485 257/410 |
| 2011/0278676 | A1 | 11/2011 | Cheng et al. | |
| 2013/0026571 | A1 | 1/2013 | Kawa | |
| 2014/0001520 | A1 | 1/2014 | Glass et al. | |

FOREIGN PATENT DOCUMENTS

| | | |
|---|---|---|
| CN | 102157555 | 8/2011 |
| KR | 10-2006-0130704 | 12/2006 |
| KR | 10-2011-0084155 | 7/2011 |
| KR | 10-2011-0084166 | 7/2011 |
| WO | WO 2005/098963 | 10/2005 |
| WO | WO 2010/080276 | 7/2010 |

OTHER PUBLICATIONS

Resistivity and Temperature Coefficient at 20 C, http://hyperphysics.phy-astr.gsu.edu/hbase/Tables/rstiv.html.*

English translation of KR 10-2017-7030778.*

Datta et al., "Impact of Contact and Local Interconnect Scaling on Logic Performance", 2014 Symposium on VLSI Technology Digest of Technical Papers, pp. 1-2 (Year: 2014).*

Notice of Allowance for Korean Patent Application No. 10-2016-7030997 dated Jul. 25, 2017, 2 pgs.

Notice of Preliminary Rejection (Non-Final) from the Korean Intellectual Property Office (KIPO) dated Jan. 18, 2017 for Korean Patent Application No. 10-2016-7030997 and English Summary thereof, 5 pages.

Second Office Action from the State Intellectual Property Office (SIPO) dated Jan. 19, 2017 and English Translation thereof for Chinese Patent Application No. 201180076472.X, 1O pages.

Notification of Granting a Patent Right (4 pages) from the State Intellectual Property Office (SIPO) dated May 2, 2017 for Chinese Patent Application No. 201180076472.X and English Translation thereof.

Office Action from the Chinese Patent Office dated May 3, 2016 for Chinese Patent Application No. 201180076472.X, 8 pages.

Notice of Allowance from the Korean Intellectual Property Office (KIPO) dated Aug. 3, 2016 for Korean Patent Application No. 10-2014-7017850 2 pages.

First Office Action from the Chinese Patent Office dated May 3, 2016 for Chinese Patent Application No. 201180076472.X.

Notice of Preliminary Rejection (Non-Final) from Korean Intellectual Property Office (KIPO) dated Feb. 16, 2016 for Korean Patent Application No. 10-2014-7017850 and English Summary thereof.

Chiacarella et al., "Benchmarking SOI and bulk FinFET alternatives for PLANAR CMOS scaling succession", Solid-State Electronics 54 (2010) 855-860.

Notice of Preliminary Rejection (Non-Final) from Korean Intellectual Property Office (KIPO) dated Jul. 29, 2015 for Korean Patent Application No. 10-2014-7017850 and English Summary thereof.

Summary of First Office Action for Taiwan Patent Application No. 101149050 dated Jun. 30, 2015.

International Search Report and Written Opinion dated Aug. 1, 2012 for PCT/US2011/068218, filed Dec. 30, 2011, 8 pages.

International Preliminary Report dated Jul. 10, 2014 for PCT/US2011/068218, filed Dec. 30, 2011, 7 pages.

Office Action for Taiwan Patent Application No. 101149050 dated Oct. 14, 2014.

Office Action from Korean Patent Application 10-2017-7030778, dated Dec. 27, 2017, 5 pages (including English language summary).

Office Action for Korean Patent Application No. 10-2017-7030778, dated May 17, 2018, 6 pages.

Office Action for Korean Patent Application No. 10-2018-7017196, dated Jul. 25, 2018, 3 pages.

Notice of Allowance for Twiwan Patent Application No. 101149050, dated Jun. 14, 2017, 3 pages.

Office Action for Korean Patent Application No. 10-2018-7017196 dated Aug. 8, 2019, 5 pages.

Office Action from Korean Patent Application No. 10-2017-7030778, dated Jul. 8, 2019, 24 pgs.

Notice of Allowance from Chinese Patent Application No. 201710003272.0, dated Apr. 3, 2020, 4 pgs.

Notice of Allowance from Chinese Patent Application No. 201710513083.8, dated Sep. 2, 2020, 8 pgs.

* cited by examiner

WRAP-AROUND TRENCH CONTACT STRUCTURE AND METHODS OF FABRICATION

CROSS-REFERENCE TO RELATED APPLICATION

This patent application is a continuation of U.S. patent application Ser. No. 13/996,523, filed Jun. 20, 2013, which is a U.S. National Phase Application under 35 U.S.C. § 371 of International Application No. PCT/US2011/068218, filed Dec. 30, 2011, the entire contents of which are hereby incorporated by reference herein.

TECHNICAL FIELD

The present invention relates generally to the manufacture of semiconductor devices. In particular, embodiments of the present invention relate to fin-based transistor devices with wrap-around source/drain contacts that improve device performance.

BACKGROUND

The limits of planar transistors have constrained efforts to increase integrated circuit performance while decreasing the size of devices. Recently developed fin-based transistors enable denser packing of device components and greater current control with the use of wrap-around dual- and tri-gates. Use of multiple fins enables further tailoring of device specifications and increased performance. However, source/drain contacts for multi-fin devices are typically formed over the top edges of the fins, which can lead to high resistance due to current crowding at the fin tips.

DETAILED DESCRIPTION

Figure 1A:
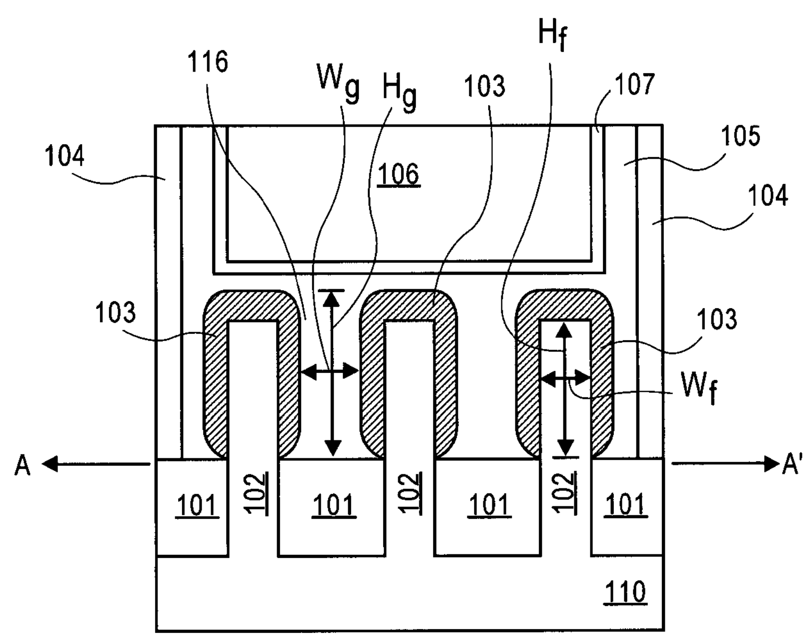
FIG. 1A illustrates a cross-sectional view of a semiconductor device with wrap-around contacts, according to an embodiment of the invention.

A wrap-around source/drain trench contact structure for use with a multi-fin transistor and methods for forming such wrap-around trench contacts are described. The present invention has been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure the present invention. Additionally, the various embodiments shown in the figures are illustrative representations and are not necessarily drawn to scale.

Wrap-around source/drain trench contacts for a multi-fin MOSFET device and methods for forming such wrap-around trench contacts are disclosed herein. The fin-based transistor structure comprises a plurality of semiconductor fins, each having a top surface and side surfaces. The fins have a high aspect ratio in the direction normal to the substrate surface, in order to increase the surface area available for device formation while maintaining a small device footprint. The high aspect ratio fins are closely spaced, creating high aspect ratio gaps between each adjacent fin. A gate stack structure wraps around the top and side surfaces of a portion of each fin defining a channel region therein. Each fin has a pair of source/drain regions on opposite sides of the channel region. An epitaxially grown semiconductor layer covers the top and side surfaces of each fin in the source/drain regions. The epitaxial semiconductor layer increases the surface area available to form source/drain contacts and narrows the gap between the fins. The gate stack structure is insulated from the epitaxial portion of the source/drain regions by gate sidewall spacers.

A source/drain trench contact structure wraps around each source/drain region by conforming to the surfaces of the epitaxial semiconductor layers, establishing contact from the top to the base of the fin. The source/drain trench contact structure comprises a contact metal layer and a fill metal. The contact metal layer is a conformal, uniformly thick layer that establishes a high surface area, low barrier height interface with the epitaxial semiconductor layers. In an embodiment, the contact metal layer completely fills each high aspect ratio gap between the fins. The contact metal layer material is selected to have a work function that minimizes the barrier height at the metal-semiconductor interface. The fill metal fills the contact trench above the contact metal layer and the fins. In an embodiment, the fill material fills a portion of the high aspect ratio gap. The fill metal comprises a conductive metal plug that is lined by a barrier layer. The barrier layer may prevent interdiffusion of the plug material and the contact metal layer material, improve adhesion of the plug and contact, and/or prevent chemical attack of the contact metal during deposition of the plug material.

While current crowding occurs in conventional multi-fin source/drain contacts that contact primarily the fin tips, the disclosed wrap-around contacts conform to the top and side surfaces of the source/drain regions of each fin, enabling a greater contact surface area and reduced current crowding without increasing fin pitch. In addition, resistance at the interface of the source/drain region of the fin with the metal contact is reduced by selecting materials to achieve a suitable metal-semiconductor barrier height. These aspects of the invention enable further control of contact resistance and drive current to improve device performance as device dimensions continue to shrink.

Figure 1B:
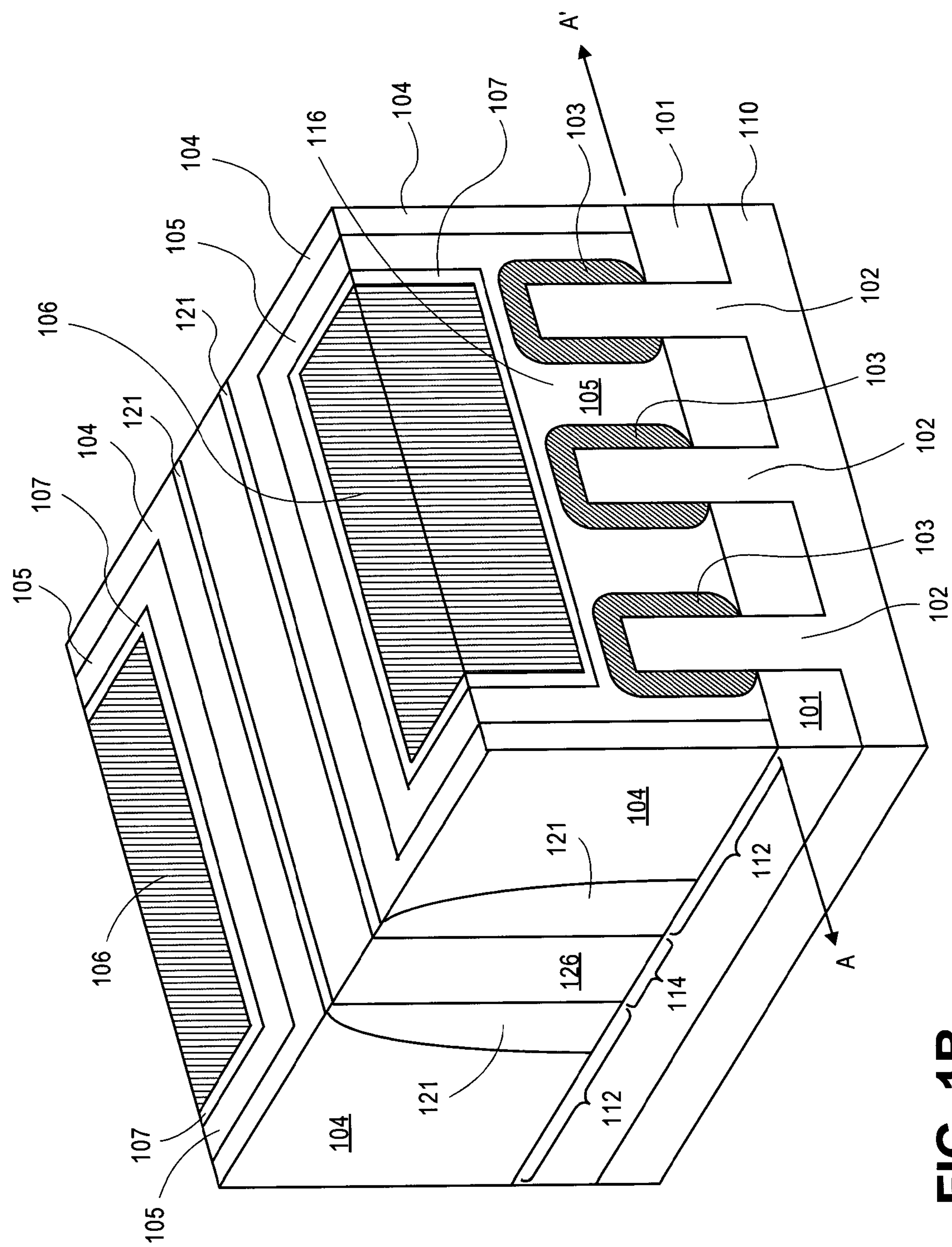
FIG. 1B illustrates a three-dimensional perspective of a semiconductor device with wrap-around contacts, according to an embodiment of the invention.

FIGS. 1A-B illustrate multiple views of a multi-fin transistor having wrap-around source/drain trench contacts. FIG. 1A illustrates a cross-sectional view through the source/drain regions of the device, taken along line A-A' in FIG. 1B. FIG. 1B is a three-dimensional perspective showing the gate portion of a multi-fin transistor and the opposing source/drain regions.

According to an embodiment of the invention, a multi-fin transistor is illustrated in FIGS. 1A-B. Fins 102 extend from semiconductor substrate 110. As an example, a three-fin device is shown for illustrative purposes, but it is to be understood that alternative embodiments may include more or fewer fins. Isolation regions 101 separate the base of each fin 102, in order to reduce current leakage from the base of the fin. Fins 102 have a high aspect ratio, which enables a wider effective gate width for a small device footprint. The fin aspect ratio is defined as the ratio of fin height Hf to fin width Wf. The fin height Hf, as shown in FIG. 1A, is the height of the fin extending above the isolation region 101 in the direction normal to the surface of substrate 110. The fin width Wf is the fin dimension perpendicular to the fin height and parallel to the cross-sectional plane of the source/drain region shown in FIG. 1A. Fins 102 may have a height of 10-100 nm and a width of 5-20 nm and may have an aspect ratio greater than 4. In an embodiment, fins 102 have a height of 50 nm and a width of 10 nm.

Gate structure 126 wraps around the side and top surfaces of a portion of the fin, defining a channel region 114 disposed in the fin. Gate structure 126 may comprise a gate dielectric and gate electrode. The gate dielectric isolates the gate electrode from the fin. Gate dielectric materials are well known in the semiconductor art, for example, a high k material, such as hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. The gate dielectric may also comprise a native oxide on the fin surface. The gate electrode may be composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction setting fill material formed above a work-function setting material.

A pair of source/drain regions 112 are disposed on opposite sides of the channel region 114. In an embodiment, each source/drain region 112 comprises a portion of the fin and an epitaxial semiconductor layer 103 grown on the fin surface. Epitaxial semiconductor layer 103 is grown on the top and sidewall surfaces of fins 102 in the source/drain regions 112 to increase surface area available for forming source/drain contacts. In addition, epitaxial semiconductor layer 103 may improve the metal-semiconductor interface between the fins and the source/drain trench contacts by correcting for damage to the fins caused by prior etching processes. In an embodiment, the growth of epitaxial semiconductor layer 103 directly from the fin surface results in a conformal or nearly conformal layer of material. In an embodiment, epitaxial semiconductor layer 103 has a uniform thickness. Epitaxial semiconductor layer 103 may be up to 20 nm thick. In an embodiment, epitaxial semiconductor layer 103 is 5 nm thick.

The source/drain regions 112 may be doped or undoped. In a specific embodiment, the source/drain regions are p-type doped to form a PMOS device. In another specific embodiment, the source/drain regions are n-type doped to form an NMOS device. The channel region 114 may be doped opposite of the source/drain regions. In addition, epitaxial semiconductor layer 103 is insulated from the sidewalls of gate structure 126 by sidewall spacers 121. In an embodiment, sidewall spacers 121 are composed of an insulative dielectric material such as, but not limited to, silicon dioxide, silicon oxy-nitride, or silicon nitride.

Fins are closely spaced in order to maintain a small device footprint. Fins 102 may be spaced from 25-70 nm apart. In a specific embodiment, fins 102 are spaced 50 nm apart. Fins 102, together with the epitaxial semiconductor layers 103 formed thereon, define a high aspect-ratio gap 116 between adjacent fins 102. The gap aspect ratio is defined as the ratio of the height Hg of gap 116—from the isolation region 101 surface to the top of the epitaxial silicon layer 103—to the width Wg of gap 116, as shown in FIG. 1A. Gaps 116 may have a height from 10 to 120 nm and a width from 15 to 50 nm. In an embodiment, gaps 116 have a height of 60 nm and a width of 20 nm. In an embodiment of the invention, gap 116 has an aspect ratio equal to 3.

Fins 102 extend from substrate 110. In an embodiment, each fin 102 is continuous and runs the full length of substrate 110. Substrate 110 and fins 102 are composed of any material suitable for semiconductor device fabrication. In one embodiment, the multi-fin structure is formed directly from a bulk substrate, such as a monocrystalline silicon substrate. In other embodiments, the bulk substrate comprises germanium, silicon-germanium or a III-V compound semiconductor material. Additionally, substrate 110 may include a buffer layer used to grade the lattice constant from a lower substrate to the material desired for the fins formed thereon. Alternatively, the structure 100 may be fabricated from a semiconductor-on-insulator (SOI) substrate. An SOI substrate includes a lower bulk substrate, a middle insulator layer and a top monocrystalline layer. In an embodiment, the SOI substrate is formed by wafer transfer. In an embodiment, fins 102 are formed from the top monocrystalline layer of an SOI substrate.

In an embodiment of the invention, a pair of source/drain trench contacts wrap around source/drain regions 112, conforming to the epitaxial semiconductor layers 103 and filling high-aspect ratio gaps 116. In an embodiment, no epitaxial semiconductor layer has been grown, and source/drain trench contacts are formed directly on the surface of fins 102. In an embodiment, the source/drain trench contacts comprise a conformal contact metal layer 105 and a fill metal. In the embodiment shown in FIGS. 1A-B, the fill metal comprises plug 106 and barrier layer 107. In an embodiment, contact metal layer 105 conforms to the surfaces defining the contact trench, such as epitaxial semiconductor layers 103, dielectric layer 104, sidewall spacer 121, and isolation regions 101, as shown in FIGS. 1A-B. In an embodiment where there is no epitaxial semiconductor layer 103 on fins 102, source/drain trench contacts are formed directly on the surface of fins 102. In an embodiment, contact metal layer 105 completely or nearly completely fills the high aspect ratio gaps between adjacent epitaxial silicon layers 103, establishing a low-conductivity path to the base of each fin 102. In an embodiment, there is no fill metal material within gaps 116, as shown in FIG. 1A. In another embodiment, fill metal extends into gaps 116. In an embodiment, there are no voids at the metal-semiconductor interface. The large contact surface area reduces resistance caused by current crowding, thereby improving device performance without increasing the device footprint. In an embodiment, contact metal layer 105 is formed to a thickness sufficient to fill gaps 116 and uniformly cover source/drain regions 112. The thickness of contact metal layer 105 may range from 1 to 10 nm. In an embodiment of the invention, contact metal layer 105 is 5 nm thick.

Contact metal layer 105 is a highly conductive material that minimizes the barrier height between epitaxial semiconductor layer 103 and contact metal layer 105, further reducing resistance in the contacts. In an embodiment of the invention, no silicide forms at metal-semiconductor interface between contact metal layer 105 and epitaxial semiconductor layer 103. In an embodiment, contact metal layer 105 comprises a material having a high conductivity of, for example, from 1.6-200 Ω-cm in order to prevent loss of transistor drive current. In an embodiment the transistor is a NMOS transistor, where the contact metal layer 105 has an n-type work function. In a specific embodiment, the NMOS transistor has n-type doped source/drain regions and a p-type doped channel region. Use of an n-type work function metal for source/drain contacts on an n-type source/drain region minimizes barrier height at the metal-semiconductor interface. The n-type contact metal layer 105 may have a work function that is between 3.9 eV and 4.2 eV. Metals that may be used for the n-type contact metal layer 105 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. A PMOS device may be made with either a p-type or n-type work function contact metal layer 105. A p-type contact metal layer 105 may have a work function that is between 5.1 eV and 5.4 eV. In a specific embodiment, the PMOS transistor has p-type source/drain regions and an n-type channel region. Contact metal layer 105 may include any of the n-type work function metals listed above, or a p-type work function metal, such as ruthenium, palladium, platinum, cobalt, nickel, conductive metal oxides such as ruthenium oxide, or conductive metal nitrides such as titanium nitride. In a specific embodiment, an integrated circuit comprises both an n-type transistor and a p-type transistor, wherein the n-type transistor has a source/drain contact comprising a contact metal with an n-type work function, and wherein the p-type transistor has a source/drain contact comprising a contact metal with a p-type work function.

In an embodiment, the fill metal formed on top of contact metal layer 105 comprises plug 106 and barrier layer 107. Plug 106 is formed above contact metal layer 105 to establish electrical contact with the source/drain region 112. In an embodiment, plug 106 has a lower resistivity than contact metal layer 105. In an embodiment, plug 106 comprises tungsten, aluminum, copper, or a combination of these. Barrier layer 107 lines plug 106 to prevent interdiffusion of contact metal layer 105 and plug 106, which could alter the work function of contact metal layer 105 and potentially increase resistance at the metal-semiconductor interface. Barrier layer 107 may be any material and thickness suitable for preventing interdiffusion without unduly interfering with the conductivity of the source/drain contact. In an embodiment, barrier layer 107 comprises titanium, titanium nitride, tantalum, tantalum nitride, hafnium, or lanthanum. Barrier layer 107 may be 1 to 5 nm thick. In an embodiment, barrier layer 107 is 2 nm thick.

Interlayer dielectric (ILD) 104 provides both intralayer insulation between the illustrated structure and neighboring components and also interlayer insulation between the layer containing the illustrated structure and any additional upper or lower device layers. Interlayer dielectric 104 may be any suitable low k material, such as, but not limited to, silicon dioxide, silicon nitride or silicon oxynitride.

Figure 2A:
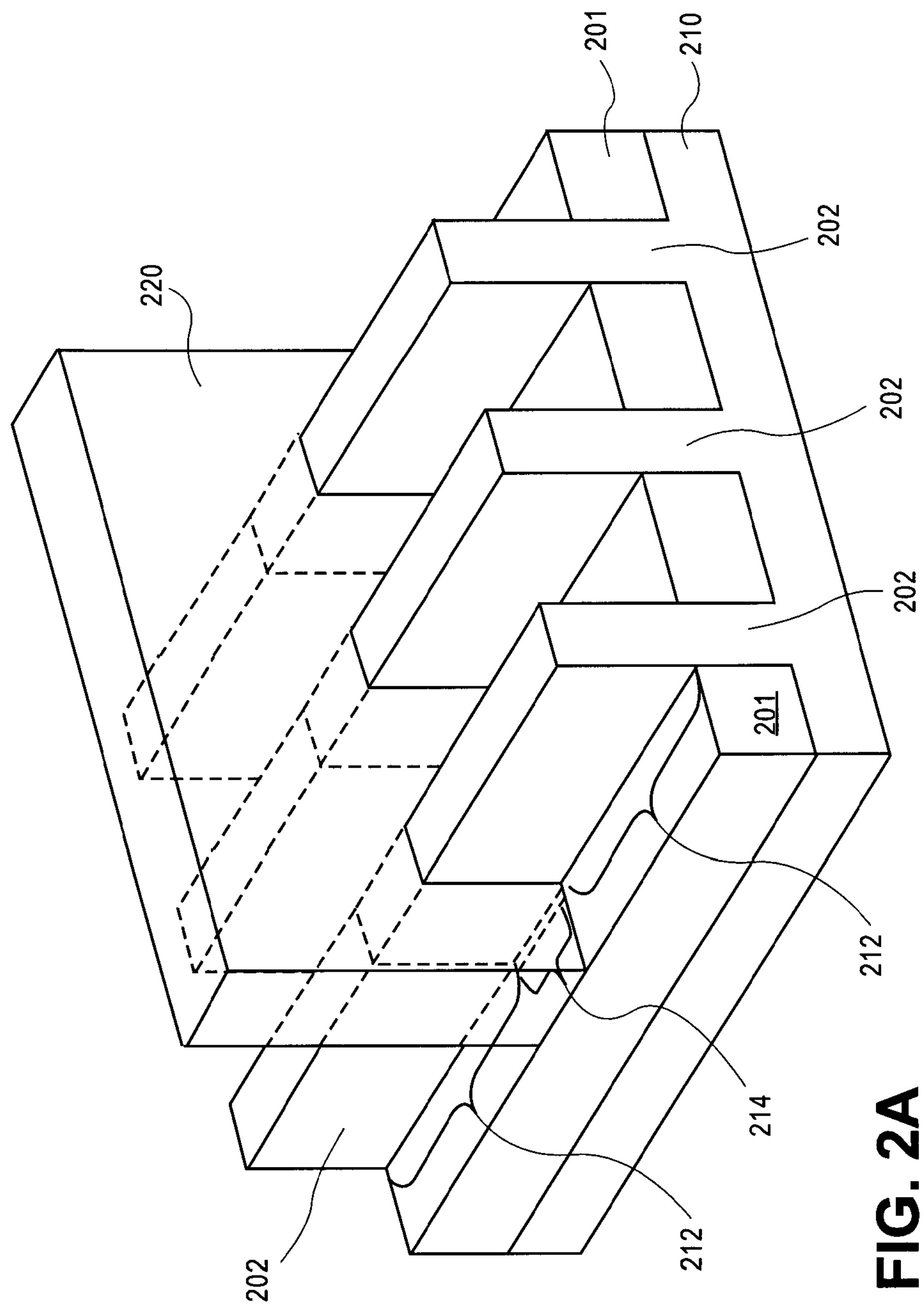
FIGS. 2A-2E illustrate a three-dimensional perspective of a process for forming a multi-fin semiconductor device, according to an embodiment of the invention.
Figure 2B:
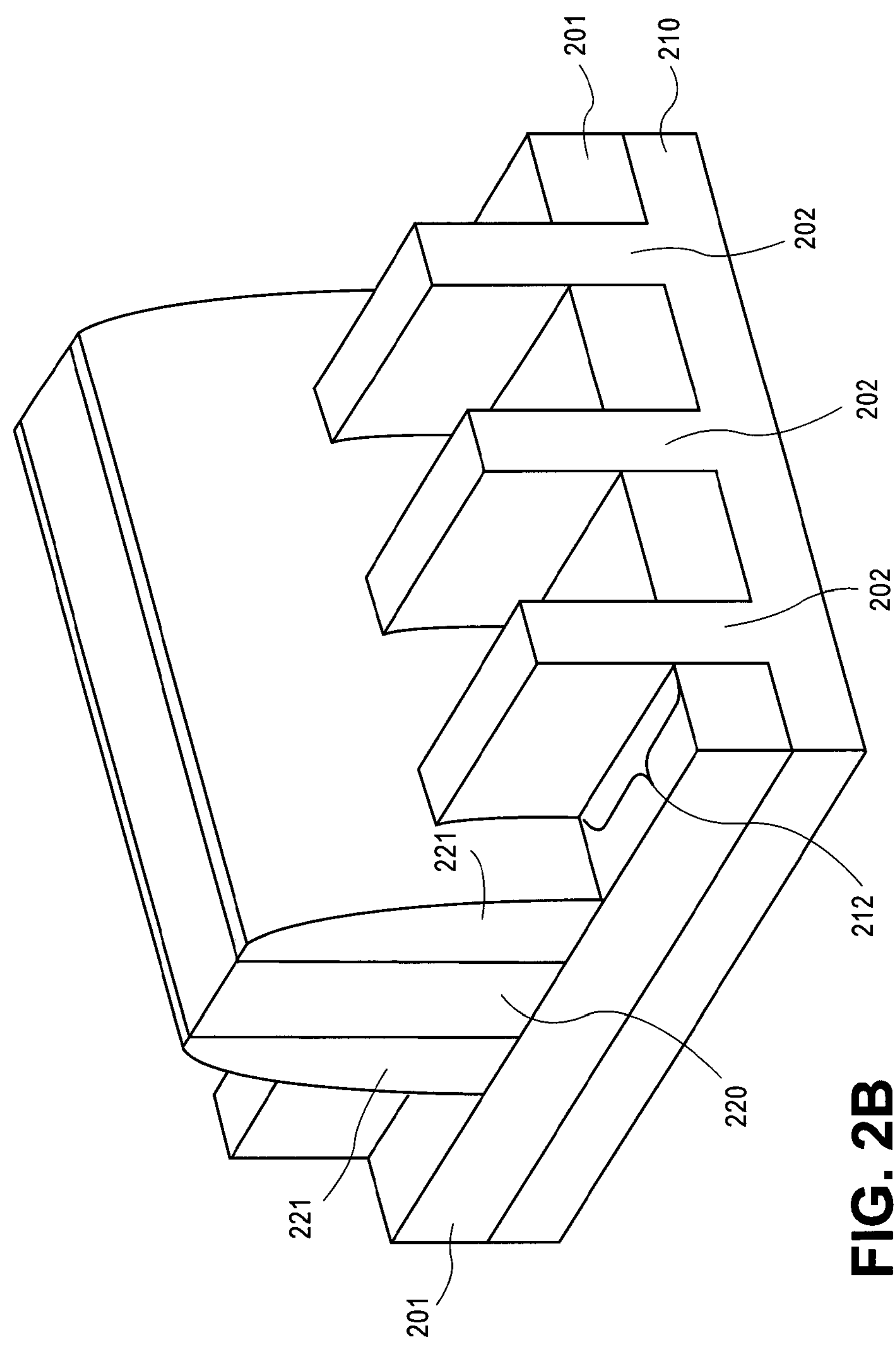
Figure 2C:
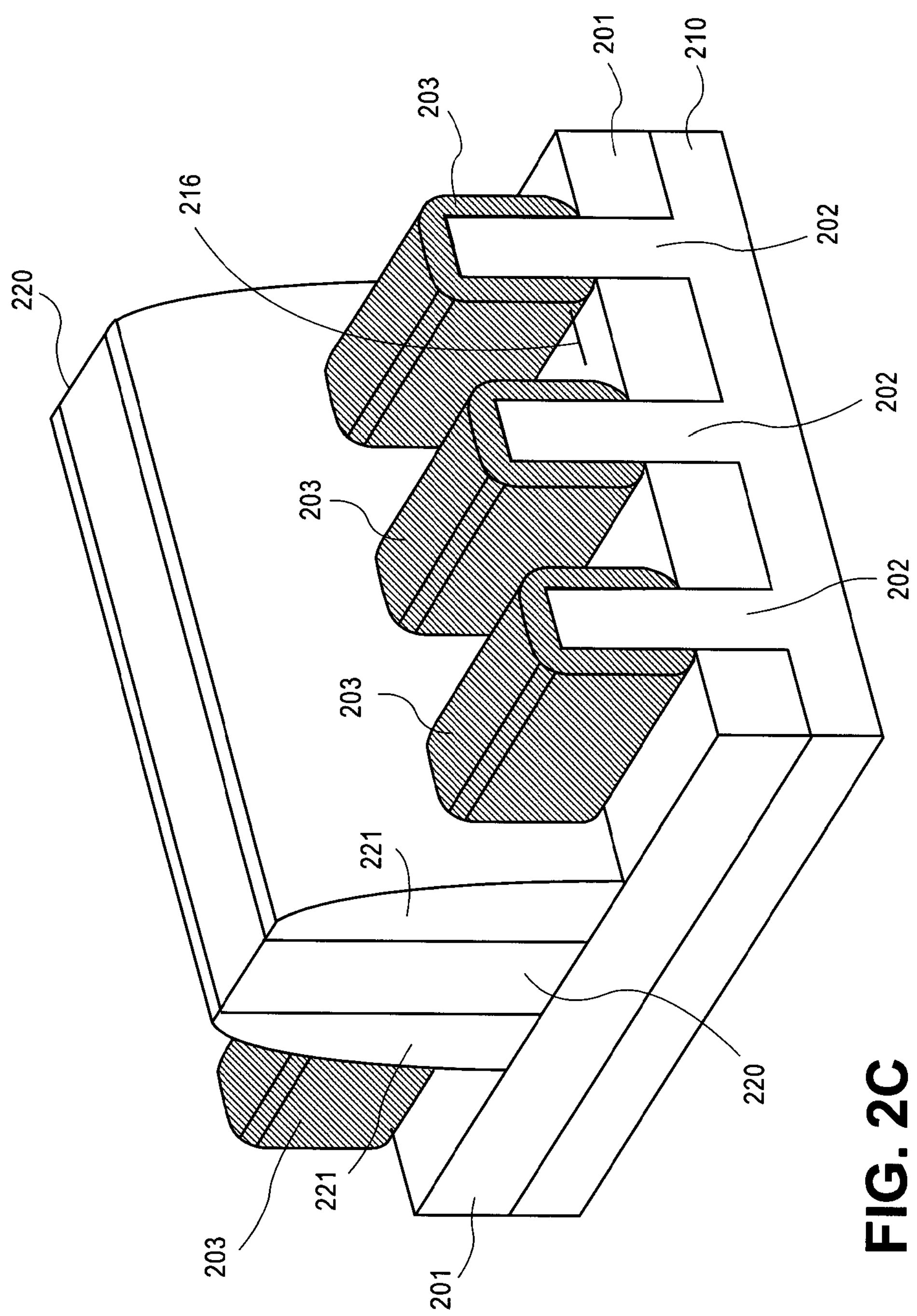
Figure 2D:
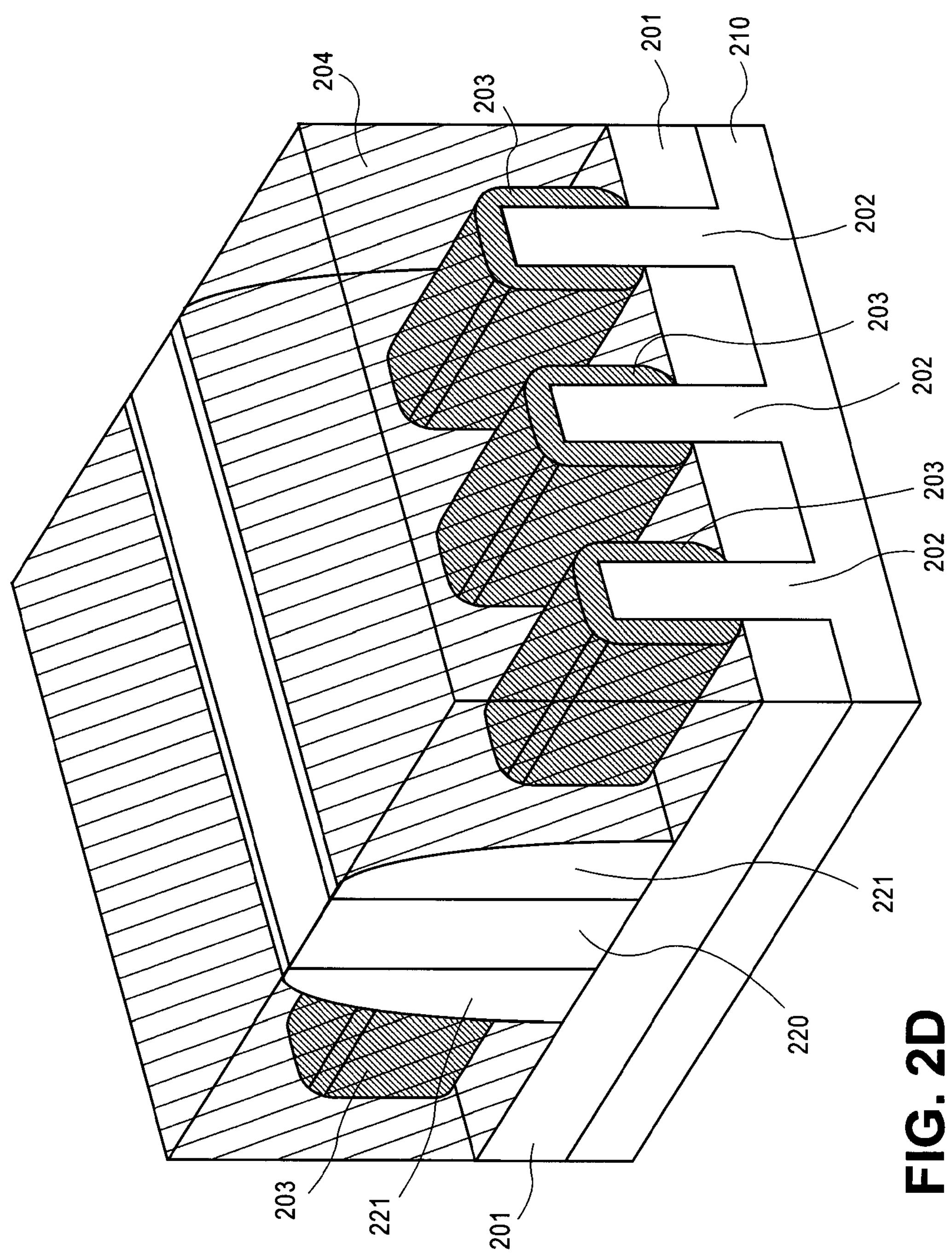
Figure 2E:
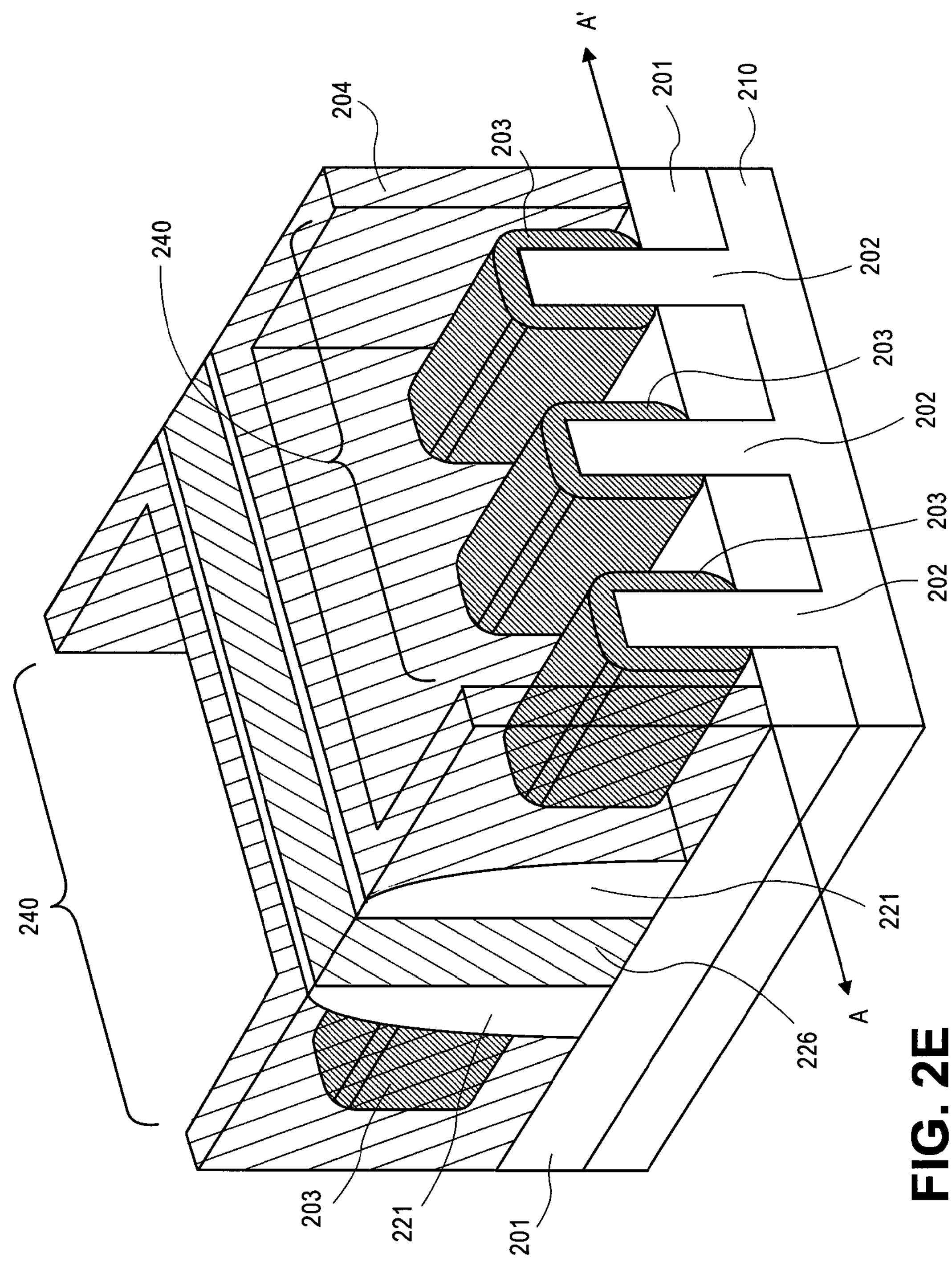
Figure 2F:
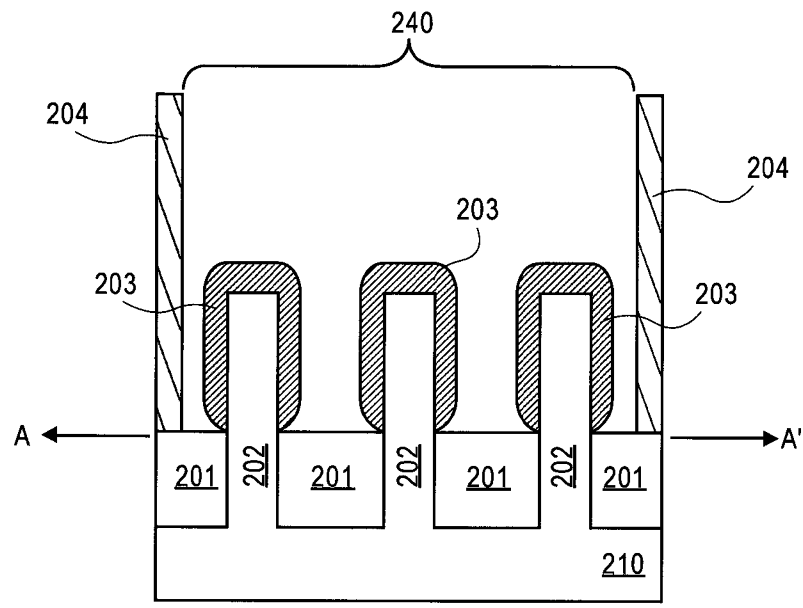
FIGS. 2F-2H illustrate a cross-sectional view of a process for forming wrap-around contacts on the source/drain regions of a multi-fin semiconductor device, according to an embodiment of the invention.
Figure 2G:
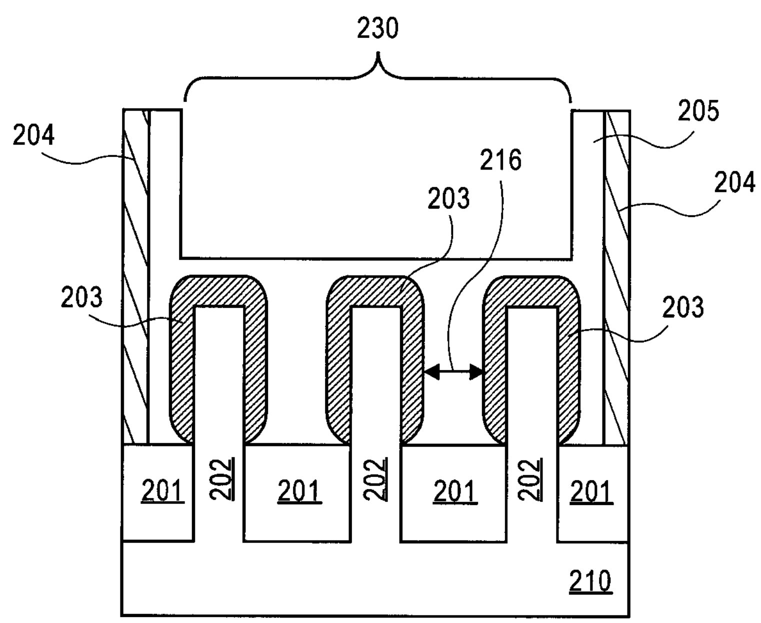
Figure 2H:
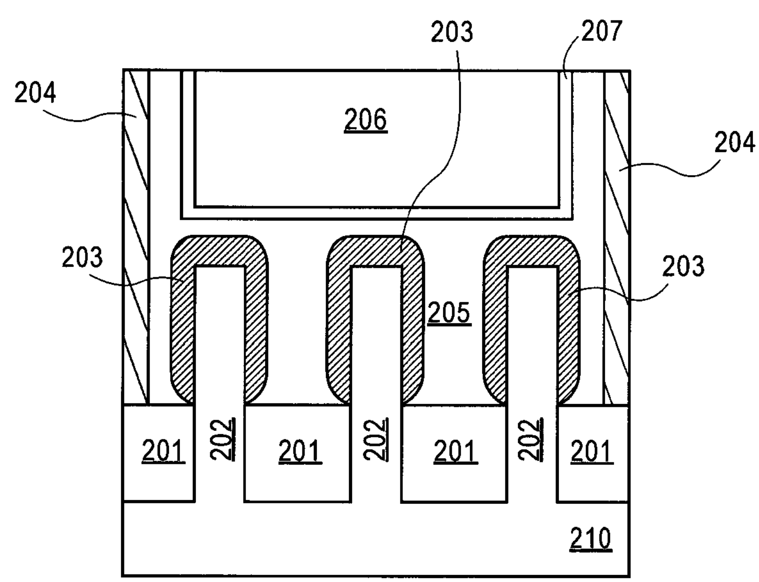

A method for forming wrap-around source/drain contacts on a fin-based semiconductor device, according to an embodiment of the invention, is illustrated by FIGS. 2A-H. FIGS. 2A-E show a three-dimensional perspective of the formation of transistor components including the gate stack and the source/drain regions. FIGS. 2F-H illustrate a cross-sectional view of the formation of a source/drain trench contact on the source/drain regions of the device.

A structure comprising a plurality of fins 202 extending from substrate 210 and a gate structure 220 wrapped around the fins to define a channel region 214 is provided, as shown in the embodiment illustrated by FIG. 2A. A pair of source/drain regions 212 are disposed in each fin 202 on opposite sides of the channel region. Fins 202 have a high aspect ratio and are closely-spaced, in order to minimize the device footprint.

In an embodiment, fins 202 are formed from a bulk substrate 210, wherein fins 202 and substrate 210 are a monocrystalline material suitable for semiconductor device fabrication. In another embodiment, fins are fabricated from an SOI substrate. As discussed above, an SOI substrate comprises a lower bulk layer, a middle insulator layer, and a top monocrystalline layer. In an embodiment, fins 202 are formed from the top monocrystalline layer of an SOI substrate, and the middle insulator layer forms the isolation region at the base of the fins. Fins 202 may be silicon, germanium, silicon-germanium, hafnium nitride, or a III-V compound semiconductor material. In a specific embodiment, fins 202 are silicon.

Isolation regions 201 are formed on the surface of substrate 210 between the bases of fins 202 to prevent leakage from the fins. Isolation regions 201 are composed of a material that may include, but is not limited to, low k dielectric materials such as silicon dioxide, silicon nitride or silicon oxynitride.

Gate structure 220 wraps around fins 202. Methods for forming gate structure 220 are known in the art. In an embodiment, gate structure 220 comprises a functional gate electrode and a gate dielectric. In another embodiment, gate structure 220 is a sacrificial gate electrode and sacrificial gate dielectric for a replacement gate process. Following the formation of gate structure 220, fins 202 may be doped, for example, by tip implantation or halo implantation, as is well-known in the art. In an embodiment, the tip and halo regions may be left as intrinsic semiconductor, such as intrinsic silicon.

Sidewall spacers 221 are formed on the sidewalls of gate structure 220 as illustrated by the embodiment shown in FIG. 2B. In an embodiment, sidewall spacers 221 isolate the gate from the epitaxial layer that will subsequently be formed on the source/drain regions of each fin. Sidewall spacers 221 may be composed of an insulative dielectric material such as, but not limited to, silicon dioxide, silicon oxy-nitride, silicon nitride, or silicon carbide. Sidewall spacers 221 may be formed by blanket deposition of a spacer layer followed by an anisotropic etching technique, where the spacer material is preserved on the gate sidewalls but removed from the fin surface. In an embodiment, an over-etch is used to remove spacer material from the sidewalls of fins 202 to enable subsequent growth of an epitaxial layer on the fin surfaces.

Next, in an embodiment, an epitaxial silicon layer 203 is formed on the top and side surfaces of the source/drain regions of fins 202 as shown in FIG. 2C. In an embodiment, epitaxial semiconductor layer 203 is the same material as fins 202, such as, but not limited to, silicon, germanium, or silicon-germanium. Epitaxial semiconductor layer 203 increases the surface area of fins 202 to enable a greater source/drain contact area. Epitaxial semiconductor layers are selectively formed on the semiconductor surfaces of the fins, but not on dielectric material surfaces. In an embodiment, adjacent epitaxial semiconductor layers 203 are distinct; that is, an epitaxial layer does not contact or merge with an adjacent epitaxial layer. The formation of epitaxial semiconductor layers 203 narrows the gap between adjacent fins 202 and extends the height of the fins, such that gaps 216 have a higher aspect ratio. Epitaxial semiconductor layers 203 are formed to a thickness sufficient to increase the surface area of the top and side surfaces of fins 202, so as to reduce current crowding in the fins. Epitaxial semiconductor layer 203 is 0-25 nm thick. In a specific embodiment, epitaxial semiconductor layer 203 is 10 nm thick. Any well known technique such as chemical vapor deposition (CVD) may be used to selectively grow the epitaxial layers. In another specific embodiment, no epitaxial semiconductor material is grown on fins 202.

Source/drain regions 212 may be doped or undoped. Heavy source/drain implants may be made into source/drain regions 212. In an embodiment, gate structure 220 protects the channel region from the doping process, while spacers 221 offset the doping from the channel region, as is well known in the art. In a specific embodiment, source/drain regions 212 are n-type doped for an n-type device. In another specific embodiment, source/drain regions 212 are p-type doped for a p-type device. Doping may be done by ion implantation, using, for example, boron for p-type dopants or phosphorous for n-type dopants. In an embodiment, source/drain regions 212 are doped prior to the formation of epitaxial silicon layer 203. In another embodiment, epitaxial silicon layer 203 is doped in situ, during the epitaxial growth process.

Next, in an embodiment of the invention, dielectric layer 204 is blanket deposited over the structure. Dielectric layer 204 may be polished to expose gate structure 220 for a replacement gate process, as shown in FIG. 2D. Gate structure 220 may comprise a sacrificial gate dielectric and a sacrificial gate electrode. During a gate replacement process, all or a portion of gate structure 220 may be removed, leaving sidewall spacers 221. In an embodiment, both the sacrificial gate electrode material and the sacrificial gate dielectric are removed. In another embodiment, the sacrificial gate electrode material is removed, and the gate dielectric material is maintained to form the gate dielectric of the subsequently formed gate stack 226. Gate stack 226 may then be formed between sidewall spacers 221. Gate stack materials are well-known in the art and discussed above with respect to FIGS. 1A-B. An embodiment of gate stack 226 includes a gate electrode and a gate dielectric. The gate electrode may comprise a work-function-setting layer and a non-work function-setting fill material. The work function-setting layer may comprise a p-type, n-type, or mid-gap material. Gate stack 226 may be planarized, such as by chemical mechanical planarization (CMP), until the top surface of the gate stack is planar with the dielectric layer 204.

In an embodiment of the invention, dielectric 204 is then etched to form source/drain contact trench 240, as shown in FIG. 2E. Source/drain contact trench 240 extends down to isolation layer 201, exposing the epitaxial semiconductor layers 203 on multiple fins. In an embodiment where there is not epitaxial semiconductor layer, the surfaces of fins 202 are exposed. In a specific embodiment, the exposed fins comprise a single device. In another specific embodiment, the contact trench 240 exposes fins that correspond to separate devices in order to form a contact connecting the adjacent devices together. Dielectric 204 may be etched by any suitable process, such as a wet etch.

FIG. 2F illustrates a two-dimensional cross-sectional view of the structure shown in FIG. 2E, taken along line A-A'. Contact trench 240 exposes the epitaxial semiconductor layers 203 on fins 202, along with portions of isolation regions 201 and dielectric 204. Fins 202 extend from substrate 210. Epitaxial silicon layers 203 are separated by gap 216, which has a high aspect ratio, greater than 2.

Contact metal layer 205 is formed in contact trench 240, as shown in the embodiment illustrated by FIG. 2G. In a specific embodiment, contact metal 205 completely fills contact trench 240. In another embodiment, contact metal layer 205 has a uniform thickness and conforms to the surfaces of the epitaxial semiconductor layer 203, along with portions of isolation regions 201 and dielectric layer 204 that are exposed within contact trench 240. In an embodiment, contact metal layer 205 completely fills gaps 216 and fills above the top surface of the epitaxial semiconductor layer 203, so as to maximize contact area and establish a low-conductivity path to the base of fins 202. In an embodiment, there are no voids at the metal-semiconductor interface. Contact metal layer 205 comprises a material selected to minimize the barrier height with respect to epitaxial semiconductor layer 203, as discussed above with respect to FIGS. 1A-B. In an embodiment, the conformal nature of contact metal layer 205 is achieved through deposition by atomic layer deposition (ALD) or CVD.

In an embodiment, contact metal layer 205 forms plug trench 230 above fins 202, as shown in FIG. 2H. In another embodiment, plug trench 230 extends into the gaps 216 between fins 202. In an embodiment, plug trench 230 is lined with barrier layer 207 and filled with plug 206. Barrier layer 207 conforms to the surface of plug 206 to prevent the interdiffusion of contact metal layer 205 and plug 206. Barrier layer 207 may also improve the adhesion of plug 206 to contact metal layer 205. Barrier layer may also prevent chemical attack of contact metal layer 205 during the deposition of plug metal 206. In an embodiment, barrier layer 107 comprises titanium, titanium nitride, tantalum, tantalum nitride, hafnium, or lanthanum. The conformal deposition of barrier layer 207 in plug trench 230 is achieved by ALD or CVD. Plug 206 may comprise a material that has a lower resistance than the material forming contact metal layer 205. In an embodiment, plug 206 comprises tungsten, aluminum, copper, or a combination of these. In an embodiment, plug 206 is blanket deposited over the substrate, filling plug trench 230. Plug 206 may be deposited by any suitable method, such as, for example, by CVD.

Next, plug 206, barrier layer 207, and contact metal layer 205 are chemically mechanically planarized, according to an embodiment of the invention. In an embodiment, an interconnect is electrically coupled to the source/drain trench contact to form an integrated circuit. Thus, a wrap-around source/drain trench contact has been disclosed.

Figure 3:
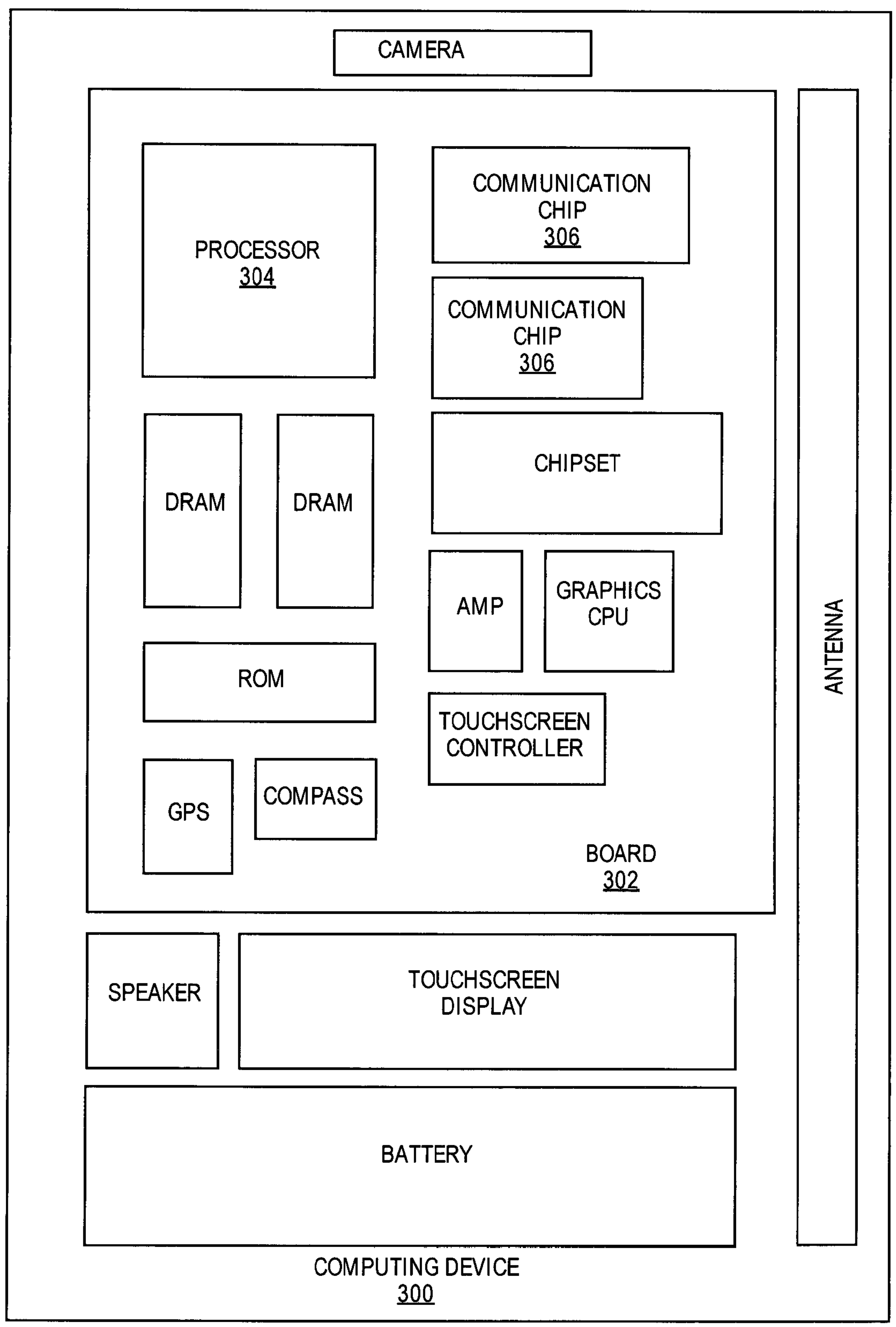
FIG. 3 illustrates a computing device in accordance with an embodiment of the invention.

FIG. 3 illustrates a computing device 300 in accordance with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more devices, such as airgap interconnects with hood layers, that are formed in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as airgap interconnects with hood layers, that are formed in accordance with implementations of the invention.

In further implementations, another component housed within the computing device 300 may contain an integrated circuit die that includes one or more devices, such as airgap interconnects with hood layers, that are formed in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

What is claimed is:

1. A semiconductor structure, comprising:

a first silicon body continuous with and extending from a monocrystalline silicon substrate through an isolation region, the first silicon body having a top and laterally opposite sidewalls;

a second silicon body continuous with and extending from the monocrystalline silicon substrate through the isolation region, the second silicon body having a top and laterally opposite sidewalls, and the second silicon body parallel with the first silicon body;

a gate electrode over the top and adjacent to the laterally opposite sidewalls of the first silicon body, over the top and adjacent to the laterally opposite sidewalls of the second silicon body, and over a portion of the isolation region, the gate electrode defining a first channel region in the first silicon body and a second channel region in the second silicon body;

a first epitaxial silicon germanium source region at a first end of the first channel region at a first side of the gate electrode;

a second epitaxial silicon germanium source region at a first end of the second channel region at the first side of the gate electrode, the second epitaxial source region laterally adjacent to but not in contact with or merged with the first epitaxial source region;

a first gap between laterally adjacent portions of the first epitaxial silicon germanium source region and the second epitaxial silicon germanium source region, the first gap over a first portion of a top surface of the isolation region between the first silicon body and the second silicon body, wherein there is no silicide in the first gap;

a first contact over the first epitaxial silicon germanium source region and the second epitaxial silicon germanium source region, the first contact comprising:

a first titanium nitride barrier layer over the first epitaxial silicon germanium source region and the second epitaxial silicon germanium source region and over but not within the first gap, wherein the first titanium nitride barrier layer has a substantially planar bottom surface, the substantially planar bottom surface continuous over the first epitaxial silicon germanium source region and the second epitaxial silicon germanium source region and between the first epitaxial silicon germanium source region and the second epitaxial silicon germanium source region; and a first tungsten plug on the bottommost portion of the first titanium nitride barrier layer and between laterally opposite sidewalls of the first titanium nitride barrier layer;

a first epitaxial silicon germanium drain region at a second end of the first channel region at a second side of the gate electrode opposite the first side of the gate electrode;

a second epitaxial silicon germanium drain region at a second end of the second channel region at the second side of the gate electrode, the second epitaxial drain region laterally adjacent to but not in contact with or merged with the first epitaxial drain region;

a second gap between laterally adjacent portions of the first epitaxial silicon germanium drain region and the second epitaxial silicon germanium drain region, the second gap over a second portion of the top surface of the isolation region between the first silicon body and the second silicon body, wherein there is no silicide in the second gap; and a second contact over the first epitaxial silicon germanium drain region and the second epitaxial silicon germanium drain region, the second contact comprising:

a second titanium nitride barrier layer over the first epitaxial silicon germanium drain region and the second epitaxial silicon germanium drain region and over but not within the second gap, wherein the second titanium nitride barrier layer has a substantially planar bottom surface, the substantially planar bottom surface continuous over the first epitaxial silicon germanium drain region and the second epitaxial silicon germanium drain region and between the first epitaxial silicon germanium drain region and the second epitaxial silicon germanium drain region; and a second tungsten plug on the bottommost portion of the second titanium nitride barrier layer and between laterally opposite sidewalls of the second titanium nitride barrier layer.

2. The semiconductor structure of claim 1, wherein the first contact is above and spaced apart from the first epitaxial silicon germanium source region, and the first contact is above and spaced apart from the second epitaxial silicon germanium source region, and wherein the second contact is above and spaced apart from the first epitaxial silicon germanium drain region, and the second contact is above and spaced apart from the second epitaxial silicon germanium drain region.

3. The semiconductor structure of claim 2, further comprising:

a first contact metal layer between the first contact and the first epitaxial silicon germanium source region and between the first contact and the second epitaxial silicon germanium source region; and a second contact metal layer between the second contact and the second epitaxial silicon germanium drain region and between the second contact and the second epitaxial silicon germanium drain region.

4. The semiconductor structure of claim 3, wherein the first tungsten plug and the second tungsten plug have a lower resistivity than the first contact metal layer and the second contact metal layer.

5. The semiconductor structure of claim 1, wherein the first titanium barrier layer and the second titanium barrier layer each have a thickness of 1 to 5 nanometers.

6. The semiconductor structure of claim 1, wherein the first titanium barrier layer and the second titanium barrier layer each have a thickness of 2 nanometers.

7. The semiconductor structure of claim 1, further comprising:

a gate dielectric layer between the gate electrode and the first silicon body, and between the gate electrode and the second silicon body.

8. The semiconductor structure of claim 7, wherein the gate dielectric layer comprises a hafnium oxide layer, and the gate electrode comprises a metal.

9. The semiconductor structure of claim 1, further comprising:

a dielectric sidewall spacer laterally adjacent to sidewalls of the gate electrode, the dielectric sidewall spacer comprising silicon nitride.

10. A semiconductor structure, comprising:

a first silicon body on an insulator layer on a monocrystalline silicon substrate, the first silicon body having a top and laterally opposite sidewalls;

a second silicon body on the insulator layer on the monocrystalline silicon substrate, the second silicon body having a top and laterally opposite sidewalls, and the second silicon body parallel with the first silicon body;

a gate electrode over the top and adjacent to the laterally opposite sidewalls of the first silicon body, over the top and adjacent to the laterally opposite sidewalls of the second silicon body, and over a portion of the insulator layer, the gate electrode defining a first channel region in the first silicon body and a second channel region in the second silicon body;

a first epitaxial silicon germanium source region at a first end of the first channel region at a first side of the gate electrode;

a second epitaxial silicon germanium source region at a first end of the second channel region at the first side of the gate electrode, the second epitaxial source region laterally adjacent to but not in contact with or merged with the first epitaxial source region;

a first gap between laterally adjacent portions of the first epitaxial silicon germanium source region and the second epitaxial silicon germanium source region, the first gap over a first portion of a top surface of the insulator layer between the first silicon body and the second silicon body, wherein there is no silicide in the first gap;

a first contact over the first epitaxial silicon germanium source region and the second epitaxial silicon germanium source region, the first contact comprising:

a first titanium nitride barrier layer over the first epitaxial silicon germanium source region and the second epitaxial silicon germanium source region and over but not within the first gap, wherein the first titanium nitride barrier layer has a substantially planar bottom surface, the substantially planar bottom surface continuous over the first epitaxial silicon germanium source region and the second epitaxial silicon germanium source region and between the first epitaxial silicon germanium source region and the second epitaxial silicon germanium source region; and a first tungsten plug on the bottommost portion of the first titanium nitride barrier layer and between laterally opposite sidewalls of the first titanium nitride barrier layer;

a first epitaxial silicon germanium drain region at a second end of the first channel region at a second side of the gate electrode opposite the first side of the gate electrode;

a second epitaxial silicon germanium drain region at a second end of the second channel region at the second side of the gate electrode, the second epitaxial drain region laterally adjacent to but not in contact with or merged with the first epitaxial drain region;

a second gap between laterally adjacent portions of the first epitaxial silicon germanium drain region and the second epitaxial silicon germanium drain region, the second gap over a second portion of the top surface of the insulator layer between the first silicon body and the second silicon body, wherein there is no silicide in the second gap; and a second contact over the first epitaxial silicon germanium drain region and the second epitaxial silicon germanium drain region, the second contact comprising:

a second titanium nitride barrier layer over the first epitaxial silicon germanium drain region and the second epitaxial silicon germanium drain region and over but not within the second gap, wherein the second titanium nitride barrier layer has a substantially planar bottom surface, the substantially planar bottom surface continuous over the first epitaxial silicon germanium drain region and the second epitaxial silicon germanium drain region and between the first epitaxial silicon germanium drain region and the second epitaxial silicon germanium drain region; and a second tungsten plug on the bottommost portion of the second titanium nitride barrier layer and between laterally opposite sidewalls of the second titanium nitride barrier layer.

11. The semiconductor structure of claim 10, wherein the first contact is above and spaced apart from the first epitaxial silicon germanium source region, and the first contact is above and spaced apart from the second epitaxial silicon germanium source region, and wherein the second contact is above and spaced apart from the first epitaxial silicon germanium drain region, and the second contact is above and spaced apart from the second epitaxial silicon germanium drain region.

12. The semiconductor structure of claim 11, further comprising:

a first contact metal layer between the first contact and the first epitaxial silicon germanium source region and between the first contact and the second epitaxial silicon germanium source region; and a second contact metal layer between the second contact and the second epitaxial silicon germanium drain region and between the second contact and the second epitaxial silicon germanium drain region.

13. The semiconductor structure of claim 12, wherein the first tungsten plug and the second tungsten plug have a lower resistivity than the first contact metal layer and the second contact metal layer.

14. The semiconductor structure of claim 10, wherein the first titanium barrier layer and the second titanium barrier layer each have a thickness of 1 to 5 nanometers.

15. The semiconductor structure of claim 10, wherein the first titanium barrier layer and the second titanium barrier layer each have a thickness of 2 nanometers.

16. The semiconductor structure of claim 10, further comprising:

a gate dielectric layer between the gate electrode and the first silicon body, and between the gate electrode and the second silicon body.

17. The semiconductor structure of claim 16, wherein the gate dielectric layer comprises a hafnium oxide layer, and the gate electrode comprises a metal.

18. The semiconductor structure of claim 10, further comprising:

a dielectric sidewall spacer laterally adjacent to sidewalls of the gate electrode, the dielectric sidewall spacer comprising silicon nitride.

* * * * *